United States Patent
Kulkarni

(10) Patent No.: US 10,175,942 B2
(45) Date of Patent: Jan. 8, 2019

(54) ELEMENTS OF PROCESSOR SOFTWARE

(71) Applicant: Ranganath Gururaj Kulkarni, Jamkhandi (IN)

(72) Inventor: Ranganath Gururaj Kulkarni, Jamkhandi (IN)

(*) Notice: Subject to any disclaimer, the term of this patent is extended or adjusted under 35 U.S.C. 154(b) by 55 days.

(21) Appl. No.: 15/118,732

(22) PCT Filed: Feb. 16, 2015

(86) PCT No.: PCT/IB2015/051132
§ 371 (c)(1),
(2) Date: Aug. 12, 2016

(87) PCT Pub. No.: WO2015/125058
PCT Pub. Date: Aug. 27, 2015

(65) Prior Publication Data
US 2017/0046126 A1 Feb. 16, 2017

Related U.S. Application Data

(60) Provisional application No. 61/941,681, filed on Feb. 19, 2014.

(51) Int. Cl.
*G06F 7/00* (2006.01)
*H03K 19/20* (2006.01)

(52) U.S. Cl.
CPC ............... *G06F 7/00* (2013.01); *H03K 19/20* (2013.01)

(58) Field of Classification Search
CPC .................................. G06F 7/00; H03K 19/20
USPC ........................................................ 708/490
See application file for complete search history.

(56) References Cited

U.S. PATENT DOCUMENTS 4,051,352 A * 9/1977 Eichelberger ...... G01R 31/2834
326/48
4,079,457 A * 3/1978 Miller ..................... G06F 7/575
708/531

(Continued)

FOREIGN PATENT DOCUMENTS

CN          102495933 A     6/2012

OTHER PUBLICATIONS

Mano, Computer system architecture, 1976 Prince-Hall, In. sector 1-4, pp. 16-22.*

(Continued)

*Primary Examiner* — Tan V Mai
(74) *Attorney, Agent, or Firm* — Clements Bernard Walker PLLC; Lawrence A. Baratta, Jr.; Elizabeth R. Kendall

(57) ABSTRACT

An arithmetic formula is discovered that can be used to reduce logic to arithmetic. The formula enables a logic algorithm to be reduced to an arithmetic algorithm without the use of logical trees, thereby converting a logical operation to an arithmetic operation. The use of the arithmetic formula enables the computation of functions that use Boolean logic. The operation of a computer program relies on logic circuits, which in turn implement Boolean logic. Considering that a computer program requires a minimum of one or more logic circuits to execute, it now becomes possible to replace the functions of these logic circuits by a computer program implementing the arithmetic formula. Therefore, it is possible to develop software that functions similar to a real processor.

18 Claims, 2 Drawing Sheets

(56) References Cited

U.S. PATENT DOCUMENTS 4,263,660 A * 4/1981 Prioste .................... G06F 7/494
708/230
2010/0058477 A1 3/2010 Ciet et al.

OTHER PUBLICATIONS

International Search Report for corresponding International Application No. PCT/IB2015/051132.
Kulkarni, Ranganath G., "Reduction of Logic to Arithmetic," Jul. 13, 2013, pp. 1, 5, 7, available at http://vixra.org/pdf/1305.0080v4.pdf.

* cited by examiner

ELEMENTS OF PROCESSOR SOFTWARE

BACKGROUND OF THE INVENTION

The field of invention is related to the elements required for the development of processor software. The elements are computer programming techniques and the computation of Boolean logic functions using a new arithmetic formula.

It was proven by Church and Turing that there is no general solution for a decision problem. For n number of inputs does any single mathematical formula capable of affirming or not affirming an output exist? Would it be possible to express the decidable fragments of full first order logic as a single mathematical formula? Numerous published research efforts indicate that decision trees can be replaced by succinct arithmetic formulas. In our work, we apply a new arithmetic formula to reduce logic to arithmetic, which is essential to elucidate the elements required for the development of processor software. As a logical algorithm can be reduced to an arithmetic algorithm without using logical trees, logical programming can be replaced by simple arithmetic programming. In other words, it is possible to convert a logical operation to an arithmetic operation. A program containing millions of if-else logical tests can therefore be replaced by a single arithmetic formula. Thus, an ordinary processor could be used to run programs that have been designed elegantly and efficiently.

Microprocessors contain both combinational and sequential logic circuits. Physical logic gates contain elementary logic gates, which can be used to design logic circuits to perform specific Boolean operations. A computer program functions by using logic circuits, which implement Boolean logic. Furthermore, the functionality of software depends on the capability of the processor, which in turn depends on the number of logic gates it contains and on the extent to which the design of the logic circuits enables them to perform specified Boolean operations. It is known that Boolean logic is decidable; hence, for a given number of inputs the output would be either True or False. The question is whether it would be possible to develop software capable of performing the functions of logic circuits or processors. Our work confirms that it is possible to develop processor software with this capability.

BRIEF SUMMARY OF THE INVENTION

An arithmetic formula is discovered that can be used to reduce logic to arithmetic. By using this arithmetic formula I have made two inventions, one of which is related to computer programming techniques for which it is known that decision trees can be replaced by succinct arithmetic formulas. The other invention is related to new processor software that can either perform the functions of logic circuits or a hardware processor. In this work, we studied the elements required for the development of processor software. The use of an arithmetic formula enables a logical algorithm to be reduced to an arithmetic algorithm without the use of logical trees, thereby converting a logical operation into an arithmetic operation. It is known that the processing speed of an arithmetic operation exceeds that of a logical operation; therefore, the conversion of a logical operation to an arithmetic operation leads to an increase in processing speed. A computer program containing millions of logical tests can be replaced by a simple arithmetic program, enabling us to perform elegant and efficient programming using an ordinary processor.

A computer program functions by using logic circuits, which implement Boolean logic. Functions relying on Boolean logic can be computed using arithmetic formulas by reducing the Boolean logic to simple arithmetic. This indicates that by employing an arithmetic formula in a computer program, it would enable us to compute Boolean logic functions. The logic circuits are designed with the purpose of performing the specified Boolean operations. The minimum requirement to execute a computer program is the presence of one or more logic circuits, the function of which can be replaced by using an arithmetic formula in the computer program. This indicates that there is no necessity for logic circuits. Thus, the task that is usually performed by logic circuits can be accomplished by employing a computer program using the arithmetic formula. Therefore, it is possible to develop software capable of performing the functions of logic circuits or a hardware processor.

DETAILED DESCRIPTION

Figure 1:
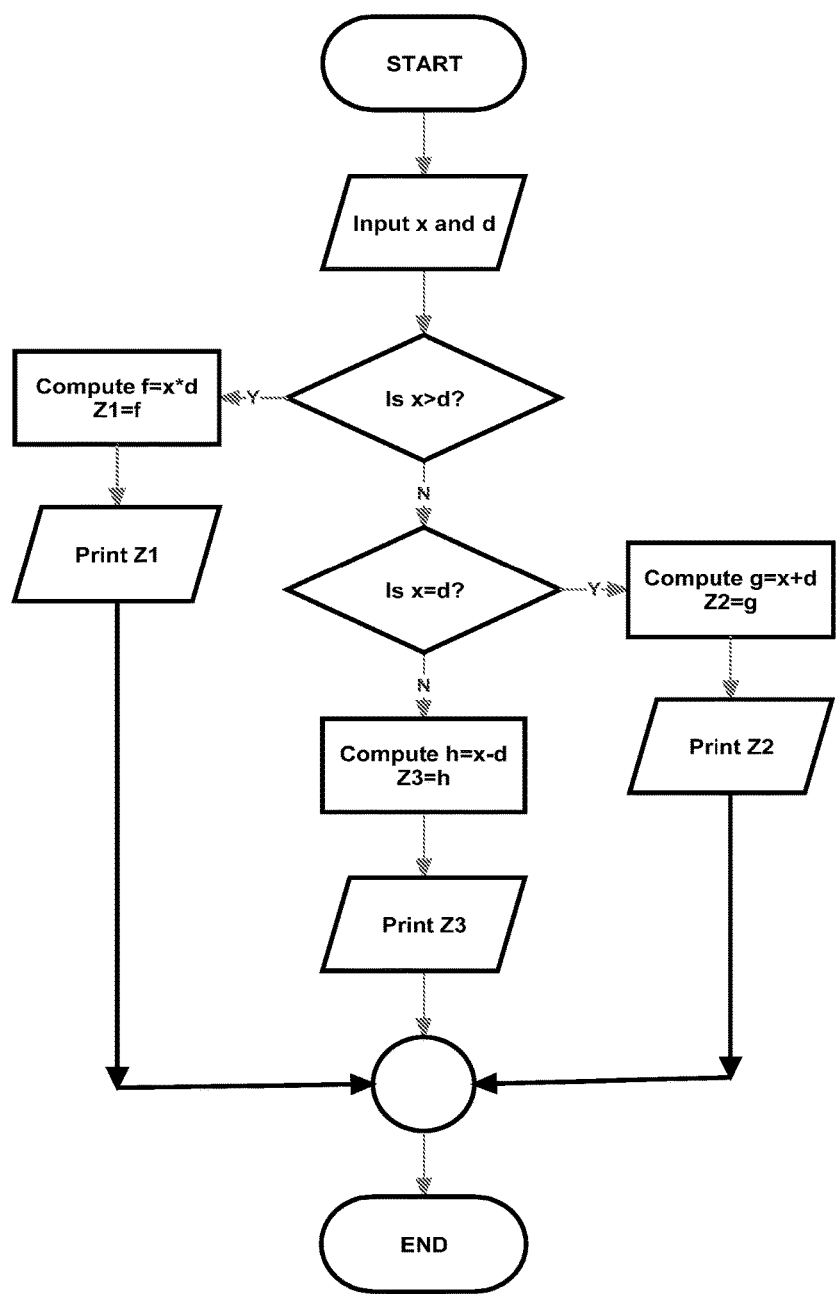
FIG. 1 is a flowchart of the computer program presented in example 1. In this case, the computer program contains a logical test.

The following description is divided into two parts. Part I describes the computer programming techniques based on the new arithmetic formula in which the decision trees have been replaced by succinct arithmetic formulas. Part II describes the computation of Boolean logic functions using the new arithmetic formula. These two parts comprise the essential elements required for the development of processor software.

Part I: Reduction of Logic to Arithmetic

For n number of inputs, is there any single mathematical formula capable of providing an affirmative or non affirmative output? As a result of our work, this has become possible because a mathematical formula has been found that can be used to reduce a logical algorithm to a simple algorithm that does not use logical trees, thereby converting a logical operation to an arithmetic operation. The formula enables us to express the decidable fragments of full first order logic as a single mathematical formula. Therefore, in a computer program, logical tests containing thousands of if-else statements can be replaced by a single mathematical equation using the proposed formula, which enables us to convert a decision algorithm into an algebraic manipulation or a mathematical equation. This changes the way in which algorithms, and hence programs, are designed.

Consider the function $Y=[[(|x|+|d|+x)/(|x|+|d|+d)] \cdot (1/e)]$, where $-\infty<d<\infty$.

Now, $Y1=|Y/\log Y|$ and $Y2=|Y1/\log Y1|$, which for n number of terms becomes $$Yn=|Yn-1/\log Yn-1|.$$

Taking the limit as $n\to\infty$ yields, for $x>d$ then $Yn=e$ and $Z=f$. For $x=d$ then $Yn=1/e$ and $Z=g$, for $x<d$ then $Yn=0$ and $Z=h$.

This result can be proven, but it is related to mathematics. We call Yn as a fundamental logic function and consider Yn as standard math library function. The function Z is given by $$Z=f[(Yn-1/e)Yn/(e-1/e)e]+g[(Yn-e)Yn/(1/e-e)(1/e)]+h[(Yn-e)(Yn-1/e)],$$

Which can be written as Z=af+bg+ch,
where a=[(Yn−1/e)Yn/(e−1/e)e], b=[(Yn−e)Yn/(1/e−e)(1/e)], and c=[(Yn−e)(Yn−1/e)].

Here f, g, and h are functions of x. This formula can be used to replace a decision algorithm by a simple algorithm, which does not use decision trees. The fundamental logic function Yn(x, d), which depends on variable x and constant d, has the functions a, b, and c. Therefore, a, b, and c are also logic functions, i.e., they can only assume two values: either 0 or 1. Logic functions a, b, and c are considered standard math library functions and their use enables us to replace logical trees by a single mathematical equation.

If x>d then a=1, b=0, c=0 and Z becomes Z=f
If x=d then b=1, c=0, a=0 and Z becomes Z=g
If x<d then c=1, a=0, b=0 and Z becomes Z=h This indicates that the logical test has three possible outcomes: greater than, equal to, or less than, where the term a indicates greater than, b indicates equal to, and c indicates less than.

If a program contains many logical tests then these can be converted into a single mathematical equation by replacing f, g, and h by Z1, Z2, and Z3, respectively, where Z1, Z2, and Z3 are of the same form as function Z. This can be clearly explained as follows.

The function Z has the independent variable x, which is compared with the constant d. In this case, the corresponding logic function is Yn, which depends on both x and d. The mathematical formula Z is expressed in terms of f, g, and h with logic function Yn, where f, g, and h are functions of x. Similarly, for the functions Z1, Z2, and Z3 the independent variables are x1, x2, and x3 and the constants are d1, d2, and d3, respectively. The corresponding logic functions are Yi, Yj, and Yk, respectively. Now the function Z can be expressed as $$Z=Z1[(Yn-1/e)Yn/(e-1/e)e]+Z2[(Yn-e)Yn/(1/e-e)(1/e)]+Z3[(Yn-e)(Yn-1/e)]$$

Here Z1=f1[(Yi−1/e)Yi/(e−1/e)e]+g1[(Yi−e)Yi/(1/e−e)(1/e)]+h1[(Yi−e)(Yi−1/e)],
where f1, g1, and h1 are functions of x1 and the logic function Yi depends on x1 and d1, respectively. The same applies to the formulas for Z2 and Z3:

$$Z2=f2[(Yj-1/e)Yj/(e-1/e)e]+g2[(Yj-e)Yj/(1/e-e)(1/e)]+h2[(Yj-e)(Yj-1/e)]$$

$$\text{and } Z3=f3[(Yk-1/e)Yk/(e-1/e)e]+g3[(Yk-e)Yk/(1/e-e)(1/e)]+h3[(Yk-e)(Yk-1/e)]$$

The application of these principles to a program containing many logical tests can be illustrated with the following example. In the above formula for Z, if x>d is true then Z becomes Z=Z1 in which case the formula Z1 undergoes a logical test as a result of the comparison of independent variable x1 with constant d1. The final result will be Z=f1 or Z=g1 or Z=h1 depending upon the value of x1 and d1. This demonstrates that it is possible to replace a program containing many logical tests with a single mathematical equation.

Programming techniques based on logic functions:
The C programming language was used to create examples to demonstrate the replacement of a logical test by a single mathematical equation.

Example 1

Consider a program, written using C, in which f, g, and h are functions of x. This can be written as:

```
main( )
{
  float x, d, f, g, h, Z1, Z2, Z3;
  printf("Enter numbers x and d" );
  scanf("%f%f", &x, &d);
  if(x>d)
  f=x*d;
  Z1=f;
    printf("Z1=%f", Z1);
    else if (x==d)
  g=x+d;
    Z2=g;
      printf("Z2=%f", Z2);
      else
    h=x−d;
      Z3=h;
      printf("Z3=%f", Z3);
}
```

The flowchart representing this computer program is shown in FIG. 1. The use of the mathematical formula enables us to replace the logical if-else test by a single mathematical equation. The function Yn, which only has three values, namely e, 1/e, and 0 for the values x>d, x=d, and x<d, respectively, is responsible for the reduction of the logic to the arithmetic. This function is called as a logic function and, to ensure the simplicity of the program, the logic function Yn is considered a standard math library function.

```
main( )
{
  float x, d, f, g, h, Z;
  printf("Enter numbers x and d ");
  scanf("%f%f", &x, &d);
  f=x*d;
  g=x+d;
  h=x−d;
  Z=af+bg+ch;
  printf("Z=%f", Z);
}
```

Figure 2:
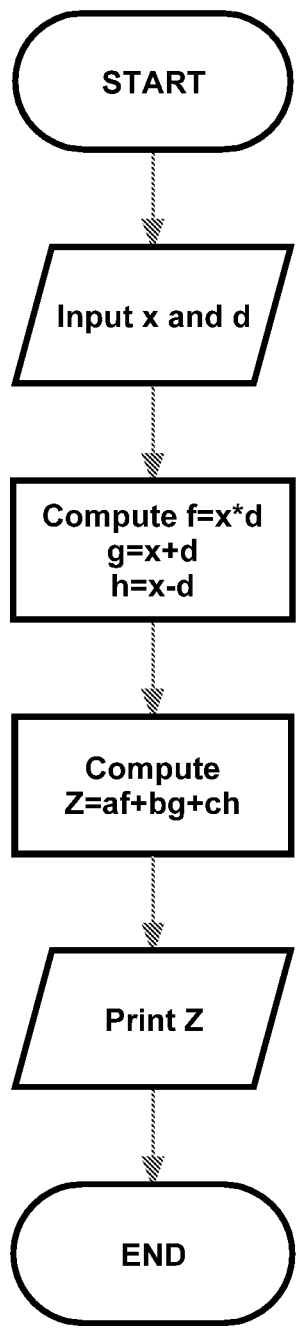
FIG. 2 is a flowchart of the computer program presented in example 1. In this case, the decision trees have been replaced by the new arithmetic formula, which converts the logical operation shown in FIG. 1 to an arithmetic operation.

The flowchart representing this computer program is shown in FIG. 2 Unlike the program shown in FIG. 1, this program does not contain a logical test. The fundamental logic function Yn converts a logical operation to an algebraic manipulation or mathematical equation.

Example 2

Consider a program written in the C language in which p, q, r, s, and t are functions of x, and d1, d2, and d3 are constants, where d1>d2>d3. In this program d1, d2, and d3 are not initially declared, because they are constant numbers.

```
main( )
{
  float x, p, q, r, s, t, Z1, Z1', Z2, Z3, Z4;
  printf("Enter the number x");
  scanf("%f", &x);
  if(x>d1)
  Z1=p;
  printf("Z1=%f", Z1);
  else if (x==d1)
  Z1'=q;
  printf("Z1'=%f", Z1');
  else if (x>d2)
  Z2=r;
  printf("Z2=%f", Z2);
  else if (x>d3)
  Z3=s;
```

```
        printf("Z3=%f", Z3);
    else
        Z4=t;
        printf("Z4=%f", Z4);
}
```

Programming can easily be accomplished by using logic functions a, b and c, which either have the value 0 or 1. In the program presented above, the first logical test determines if x>d1, in which case the fundamental logic function for the variable x and constant d1 is Yi(x, d1). The corresponding logic functions are a1, b1, and c1, in which case if x>d1 then a1=1, b1=0, and c1=0 else a1=0. Similarly, in the second logical test, which determines if x=d1, then b1=1, c1=0, and a1=0 else b1=0. In the third logical test, which determines if x>d2, the fundamental logic function for the variable x and constant d2 is Yj(x, d2) and the corresponding logic functions are a2, b2, and c2. In this case if x>d2 then a2=1, b2=0, c2=0 else a2=0. The fourth logical test determines if x>d3, in which case the fundamental logic function for the variable x and constant d3 is Yk(x, d3) and the corresponding logic functions are a3, b3, and c3. In this case, if x>d3 then a3=1, b3=0, c3=0 else a3=0.

The logical trees in the above mentioned program can be replaced by a single mathematical equation which is given by Z=(a1p+b1q)+c1[a2r+(b2+c2)(a3S+(b3+c3)t)]

Although this equation appears complicated, it is simple to formulate. Now, it becomes obvious how the functions in the program can be expressed as a single mathematical equation, which can be written as $Z=a1p+b1q+c1h$. Here $h=a2r+(b2+c2)I$, where $I=a3S+(b3+c3)t$ The equations Z, h, and I assume the form of the reduction formula Z=af+bg+ch, which has three terms, and where the term a indicates greater than, b indicates equal to, c indicates less than.

In the above mentioned program, the first logical test determines if x>d1. If this is true then a1=1, b1=0, and c1=0; therefore, the first term of equation Z is a1p. The second logical test determines if x=d1 in which case b1=1, c1=0, a1=0; thus, the second term is b1q. If both of these tests are false, the third term c1h is determined. In this case, the function h contains a logical test; hence, if x>d2 is true then the first term is a2r, but if x>d2 is not true then the next logical test determines if either x=d2 or x<d2. However, there is no logical test to determine if both of these functions are true. Therefore, the second and third terms are b2I and c2I, respectively. In the third term the function 1 contains a logical test to determine if x>d3 is true, in which case the first term is a3S. If this test fails, then the next logical test determines if either x=d3 or x<d3. However, there again is no logical test to determine if both of these functions are true. Therefore, the second and third terms are b3t and c3t, respectively. As the function t does not contain a logical test, the program finally terminates.

Consequently, it is possible to write a program in C using a single mathematical statement by using logic functions (a1, b1, c1), (a2, b2, c2), and (a3, b3, c3):

```
main( )
{
    float x, p, q, r, s, t, Z;
    printf("Enter the number x");
    scanf("%f", &x);
```
```
    Z=(a1p+b1q)+c1[a2r+(b2+c2)(a3s+(b3+c3)t)];
    printf("Z=%f", Z);
}
```

Example 3

In this example, the C language is used to demonstrate a method in which a single mathematical statement containing AND and OR operations is used. The program uses functions p, q, r, and s, all of which are functions of x. The variables are x, x1, x2, x3, and x4, whereas d, d1, d2, d3, and d4 are constants. In this program, d, d1, d2, d3, and d4 are not declared in the initial statement, because they are constants.

```
main( )
{
    float x, x1, x2, x3, x4, p, q, r, s, Z1, Z2, Z3, Z4;
    printf("Enter the numbers x, x1, x2, x3, x4");
    scanf("%f%f%f%f%f", &x, &x1, &x2, &x3, &x4);
    if (x>d && x1>d1)
        Z1=p;
        printf("Z1=%f", Z1);
    else if (x2>d2 || x3>d3)
        Z2=q;
        printf("Z2=%f", Z2);
    else if (x4>d4)
        Z3=r;
        printf("Z3=%f", Z3);
    else
        Z4=s;
        printf("Z4=%f", Z4) ;
}
```

Now, the program provided above can be rewritten by using logic functions. The fundamental logic functions for the logical tests x>d, x1>d1, x2>d2, x3>d3, and x4>d4 are Yi(x, d), Yj(x1, d1), Yk(x2, d2), Yl(x3, d3), and Ym(x4, d4), respectively. The corresponding logic functions are (a, b, c), (a1, b1, c1), (a2, b2, c2), (a3, b3, c3), and (a4, b4, c4), respectively.

Consider the first logical test in the above mentioned program, which is if(x>d && x1>d1). In this statement, if both logical tests are true then the result of the whole statement is true. The comparison x>d represents a and x1>d1 represents a1. Therefore, the overall result, which is true, is given by aa1. This is the only valid term for the AND operation. However, the logical test has three possible outcomes: greater than, equal to, or less than. Therefore, a expands to a+b+c and a1 expands to a1+b1+c1. Now aa1 becomes (a+b+c)(a1+b1+c1)=aa1+a(b1+c1)+a1 (b+c)+(b+c)(b1+c1)

In this case the only term that is true if both logical tests are true, is aa1, which means that, for the remaining terms, of the outcome of the AND operation is false. In combination, the true and false results of the AND operation can be expressed as $$Z=aa1p+[a(b1+c1)+a1(b+c)+(b+c)(b1+c1)]h \qquad (1)$$

Here the function h contains a logical test consisting of an OR operation: if (x2>d2||x3>d3), for which the comparison x2>d2 represents a2 and the comparison x3>d3 represents a3. The result of this OR operation is true if either or both of the logical tests is true.

Assuming the outcome of the first logical test a2 of this OR operation is true, the second logical test of this operation has three possible outcomes: a3 or b3 or c3. For this combination, the true result of the OR operation has the terms a2(a3+b3+c3). Now, assuming a3 is true, then the first logical test of the OR operation has three possible outcomes: a2 or b2 or c2. For this combination, the true result of the OR operation contains the terms a3(a2+b2+c2). Therefore, the terms of the OR operation for which the result is true are given by a2(a3+b3+c3)+a3(a2+b2+c2)

As the term a2a3 occurs twice in this result, it is only necessary to use it once; therefore, the terms become a2(a3+b3+c3)+a3(b2+c2)

All the terms, both true and false, resulting from the OR operation are obtained by expanding a2a3 to (a2+b2+c2)(a3+b3+c3)=a2(a3+b3+c3)+a3(b2+c2)+(b2+c2)(b3+c3), in which case it becomes possible to express the function h for both true and false results of the OR operation as $$h=[a2(a3+b3+c3)+a3(b2+c2)]q+(b2+c2)(b3+c3)I \quad (2)$$

In equation (2) the function I contains the logical test if(x4>d4). The comparison x4>d4 indicates a4. If a4 is true then the result is given by a4r, but if the result of this test is false, then the logical test has two possible outcomes: either b4 or c4. However, there is no logical test to determine if both of these outcomes are true. Therefore, if x4>d4 is not true then the result is given by (b4+c4)s. Now, we can express the function I for both the true and false results of the logical test by $$I=a4r+(b4+c4)s \quad (3)$$

In equation (3), the function s does not contain a logical test. Therefore, the program finally terminates. Substituting function I in equation (2) and then substituting function h in equation (1) leads to a single mathematical statement for the computer program given above:

$$Z=aa1p+[a(b1+c1)+a1(b+c)+(b+c)(b1+c1)]\{[a2(a3+b3+c3)+a3(b2+c2)]q+(b2+c2)(b3+c3)(a\ 4r+(b4+c4)s)\}$$

Again using the C language to reformulate the above mentioned program using a single mathematical equation, gives the following:

```
main( )
{
  float x, x1, x2, x3, x4, p, q, r, s, Z;
  printf("Enter the numbers x, x1, x2, x3, x4");
  scanf("%f%f%f%f%f", &x, &x1 , &x2, &x3, &x4);
  Z=aa1p+[a(b1+c1)+a1(b+c)+(b+c)(b1+c1)]{[a2(a3+b3+c3)+a3(b2+c2)]q+
  (b2+c2)(b3+c3)(a4r+(b4+c4)s)};
    printf("Z=%f", Z);
}
```

Therefore, the use of the proposed formula together with optimization techniques enables us to design elegant and efficient programs in which logical operations are reduced to arithmetic operations. This makes it possible to execute a complex program using an ordinary processor; hence, the software can be developed to run on an ordinary processor. This approach to designing software would therefore be useful for tablet computers and other computing devices with ordinary processors.

Part II: Computation of Boolean Logic Functions Using Arithmetic Formulas

The computation of Boolean logic functions can be performed using an arithmetic formula. An arithmetic formula capable of computing Boolean functions was found and its development is described in this part of the document. This approach can also be used to solve the satisfiability (SAT) problem. Simple logic circuits can be used to perform complex Boolean operations. Physical logic gates contain elementary logic gates that can be used to construct logic circuits to perform specified Boolean operations. As shown in Part I of this document, the use of an arithmetic formula enables us to perform AND, OR, and NOT elementary logical operations. The logic circuits implement Boolean logic. The procedure for computing the Boolean function using an arithmetic formula involves the conversion of the binary input (0 or 1) to decimal input, which is also provided in the format 0 or 1. With the aid of an arithmetic formula, a computer program can be used to compute the output in the same decimal format, namely 0 or 1. This decimal output is subsequently converted back into binary form. In this procedure, the function performed by logic circuits is therefore replaced by the computation of an arithmetic formula.

The arithmetic formula can be used to perform Boolean operations ranging from elementary to complex. The purpose of designing combinational and sequential logic circuits, both of which are found in microprocessors, is to perform specified Boolean operations. It is possible to compute any Boolean logic function by using an arithmetic formula; in other words, an arithmetic formula can be used to perform the same Boolean operation that is performed by combinational and sequential logic circuits. All that is required to accomplish the task of logic circuits is a computer program in which the arithmetic formula is implemented. A computer program requires a minimum of one or more logic circuits to enable it to execute and the functions of these logic circuits can be replaced by an arithmetic formula in the computer program. Therefore, computer software can be developed to perform the functions of logic circuits, that is, to perform the function of the processor. This new kind of software is referred to as processor software. The functionality of any software depends on the capability of the processor on which the software is executed. In turn, the capability of the processor depends on the design of the logic circuits and the number of logic gates it contains. The use of processor software therefore enables us to develop software for devices that do not necessarily have a powerful processor, such as mobile tablet computers and other similar computing devices.

Consider the function $$Z=f[(Yn-1/e)Yn/(e-1/e)e]+g[(Yn-e)Yn/(1/e-e)(1/e)]+h[(Yn-e)(Yn-1/e)]$$

where f, g, and h are functions of x. Setting f=g enables us to express the arithmetic formula as $$Z=ag+bh,$$

where $a=[\{(Yn-1/e)Yn/(e-1/e)e\}+\{(Yn-e)Yn/(1/e-e)1/e\}]$ and $b=[(Yn-e)(Yn-1/e)]$ Setting d=1 we find that for x≥1, a=1, b=0; thus, Z=g. Further, for x<1, a=0, b=1; thus, Z=h.

Calling a and b as logic functions which depend on the fundamental logic function Yn(x, d), means the value of a and b can either be 0 or 1 (the binary number system only has only two values: 0 and 1 and the conversion of 0 and 1 to decimal numbers also produces the values 0 and 1.) In this case, the decimal input is represented by x, which can either assume the value 0 or 1, which implies that there is no number greater than 1. In other words, x has a discrete value, which can be either 0 or 1.

Using logic functions a and b, we can express the Boolean function as an arithmetic formula. Next, the implementation of the arithmetic formula of a and b is demonstrated for both combinational and sequential logic circuits.

NOT gate:

The Boolean function for a NOT gate is given by Q=A', where the binary input A has two values: either 0 or 1. Using an arithmetic formula enables us to express the NOT function as Z=aF+bT, where g=F and h=T. In this case, the decimal input is x, which either has the value 0 or 1. In the function, F represents false with a value of 0, whereas T represents true with a value of 1. The values of T and F are in the decimal number system; therefore, the output Z is also a decimal number.

The result of the operation is verified next. For binary input A=0 the binary output is Q=1 Converting the binary input A=0 to decimal input, which is x=0, the values a=0, b=1 are obtained for x=0, in which case Z=T. However, T=1, which means that Z=1, for which the decimal output is Z=1. After converting the decimal output to a binary number, the binary output is obtained as 1.

Similarly, for binary input A=1 the binary output is Q=0. Converting the binary input A=1 to decimal input, which is x=1, for which a=1, b=0; thus, Z=F. However, F=0, which means that Z=0, for which the decimal output is Z=0. After converting the decimal output to a binary number, the binary output is obtained as 0.

AND gate:

The AND operation for two binary inputs A and B is given by Q=AB. The truth table for this Boolean function is given below in Table 1.

TABLE 1

| A | B | Q = AB |
|---|---|--------|
| 0 | 0 | 0 |
| 0 | 1 | 0 |
| 1 | 0 | 0 |
| 1 | 1 | 1 |

It now becomes possible to compute this Boolean function by using an arithmetic operation. The decimal input corresponding to binary input A is x. The fundamental logic function for the variable x and constant d=1 is Yn(x, 1). The corresponding logic functions are (a, b). The decimal input corresponding to binary input B is x1. The fundamental logic function for the variable x1 and constant d=1 is Ym(x1, 1). The corresponding logic functions are (a1, b1).

In a logical AND operation, if both of the binary inputs are true then the result is also true. Furthermore, in the decimal number system the binary inputs for A=1 and B=1 are x=1 and x1=1, respectively. The values of the corresponding logic functions are a=1, b=0 and a1=1, b1=0, respectively.

The output of the AND operation for Q=AB, which in this case is true, is therefore given by aa1. Expansion of the term a by (a+b) and a1 by (a1+b1) means that aa1 becomes (a+b)(a1+b1)=aa1+b(a1+b1)+ab1. In this case the output term, which is true, is given by aa1, whereas both of the remaining terms produce a false result for the AND operation. The arithmetic expression for the AND operation is given by:

$$Z=aa1T+[ab1+b(a1+b1)]F$$

For the expression Z, the values of T and F are expressed as decimal numbers. The values of T and F are 1 and 0, respectively. The NAND operation can be expressed arithmetically by interchanging T and F; thus, Z=aa1F+[ab1+b(a1+b1)]T.

OR gate:

The OR operation for two binary inputs A and B is given by Q=A+B. The truth table for this Boolean function is given below in Table 2.

TABLE 2

| A | B | Q = A + B |
|---|---|-----------|
| 0 | 0 | 0 |
| 0 | 1 | 1 |
| 1 | 0 | 1 |
| 1 | 1 | 1 |

This OR Boolean function is computed using an arithmetic operation. The decimal input corresponding to binary input A is variable x. The fundamental logic function for this variable and constant d=1 is Yn(x, 1), for which the corresponding logic functions are (a, b). The decimal input corresponding to binary input B is x1. The fundamental logic function for variable x1 and constant d=1 is Ym(x1, 1), which has the corresponding logic functions (a1, b1).

In a logical OR operation, if both of the binary inputs are false then the overall result is false, otherwise the result is true. In the decimal number system the binary inputs for A=0 and B=0 are x=0 and x1=0, respectively. The values of the corresponding logic functions are b=1, a=0 and b1=1, a1=0, respectively.

In this case, the output of the OR operation for Q=A+B, which is false, is given by bb1, which is expanded to give (a+b)(a1+b1)=bb1+[a(a1+b1)+ba1]. Here, the output term, which is false, is given by bb1 and the remaining terms represent the true results of the OR operation. The arithmetic expression for OR operation is given by $$Z=[a1b+a(a1+b1)]T+bb1F$$

Interchanging T and F leads to the arithmetic expression for the NOR operation, which is given by Z=[a1b+a(a1+b1)]F+bb1T Full Adder:

The Full Adder operation has binary inputs, namely A, B, and carry C. The operation has two outputs given by $S=A+B+C_{in}$ and $C_{out}=AB+C_{in}(A+B)$ The truth table of these Boolean functions is given below in Table 3.

TABLE 3

| A | B | $C_{in}$ | $C_{out}$ | S |
|---|---|------|-------|---|
| 0 | 0 | 0 | 0 | 0 |
| 1 | 0 | 0 | 0 | 1 |
| 0 | 1 | 0 | 0 | 1 |
| 1 | 1 | 0 | 1 | 0 |
| 0 | 0 | 1 | 0 | 1 |
| 1 | 0 | 1 | 1 | 0 |
| 0 | 1 | 1 | 1 | 0 |
| 1 | 1 | 1 | 1 | 1 |

The two Boolean functions S and $C_{out}$ are computed using an arithmetic operation. The decimal inputs corresponding to binary inputs A, B, and $C_{in}$ are x, x1, and x2, respectively. The fundamental logic functions for the variables x, x1, and x2 and constant d=1 are Yl(x, 1), Ym(x1, 1), and Yn(x2, 1), respectively, for which the corresponding logic functions are (a, b), (a1, b1), and (a2, b2), respectively.

The binary numbers are 0 and 1, and have equivalent values in the decimal number system of 0 and 1. Considering the inputs in the truth table for which the output of S is 1, the values x=1, x1=0, and x2=0 produce the output 1, with the corresponding term of the true result given by ab1b2. The other inputs that also produce the output S=1, are x=0, x1=1, and x2=0; x=0, x1=0, and x2=1; and x=1, x1=1, and x2=1, with the corresponding terms of the true result given by ba1b2, bb1a2, and aa1a2, respectively.

Expanding aa1a2 to (a+b)(a1+b1)(a2+b2), followed by the grouping of the terms with true and false outcomes leads to the arithmetic expression for the Boolean function S:

$$Z=[a(a1a2+b1b2)+b(a1b2+a2b1)]T+[a(a1b2+a2b1)+b(a1a2+b1b2)]F$$

Similarly, the arithmetic expression for the Boolean function $C_{out}$ is given by $$Z_{out}=[aa1(a2+b2)+a2(ab1+a1b)]T+[b1b2(a+b)+b(a1b2+a2b1)]F.$$

JK FlipFlop:

The JK FlipFlop operation has two binary inputs J and K, and one clock signal Q. Its output is given by the Boolean function $Q_{next}$=JQ'+K'Q, the truth table of which is given below in Table 4.

TABLE 4

| J | K | Q | $Q_{next}$ |
|---|---|---|------------|
| 0 | 0 | 0 | 0 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0 |

The Boolean function $Q_{next}$ is computed by using an arithmetic operation. The decimal inputs corresponding to the binary inputs J, K, and Q are x, x1, and x2, respectively, and the fundamental logic functions for the variables x, x1, and x2 and constant d=1 are Yl(x, 1), Ym(x1, 1), and Yn(x2, 1), respectively. The corresponding logic functions are (a, b), (a1, b1), and (a2, b2), respectively. The arithmetic expression for the Boolean function $Q_{next}$ is given by:

$$Z_{next}=[a(a1b2+a2b1)+b1(a2b+ab2)]T+[a1a2(a+b)+bb2(a1+b1)]F.$$

The above mentioned examples of combinational and sequential logic demonstrates that the function of combinational and sequential logic circuits can be replaced by computer programming by using arithmetic formulas a and b. The sequential logic is time dependent; hence, the output not only depends on the present value of its input signals but also on the past history of its inputs. It is also possible to express both the combinational and sequential logic as an arithmetic expression by observing the truth table of the function. If the Boolean formula it not known, but the truth table is available, then that Boolean function can be expressed as an arithmetic formula by grouping the terms with true and false outcomes together and using logic functions a and b; in other words, the SAT problem is solved. Thus, the use of simple logic circuits enables us to perform complex Boolean operations.

A microprocessor contains combinational and sequential logic circuits. We construct logic circuits to perform specified Boolean operations. In general, logic circuits perform both arithmetic and logical operations. A computer program functions by using logic circuits, which in turn implement Boolean logic. An arithmetic formula is found that can be used to reduce logic to arithmetic; in other words, we can compute Boolean functions using an arithmetic formula. A computer program requires a minimum of one or more logic circuits to enable it to execute, and the functions of these logic circuits can be replaced by a computer program using an arithmetic formula. This obviates the need for logic circuits to perform a required Boolean operation. We have demonstrated that it is possible to replace the functions of logic gates and logic circuits, such as Full Adder and JK FlipFlop, by arithmetic formulas. All that is required to accomplish the task of these elementary logic gates and circuits is a computer program using an arithmetic formula. Therefore, it becomes possible to develop software capable of performing the functions of logic circuits or the processor. This new type of software is referred to as processor software. The capability of a processor depends on the design of the logic circuits and the number of logic gates the processor contains. Similarly, the capability of processor software depends on the way in which the software was developed and thus its ability to perform all the specified Boolean operations. In other words, the ability of processor software to perform all the specified Boolean operations is a measure of the capability of the processor software. Processors used in mobile tablets and computers have different capabilities. The use of arithmetic formulas to replace the function performed by logic circuits and logic gates therefore enables us to develop processor software for devices of any size, such as mobile, tablet computers, and all other computing devices.

REFERENCES

1. Turing, A. M. "On Computable Numbers, with an Application to the Entscheidungsproblem". Proceedings of the London Mathematical Society, series 2, 42 (1936-37), 230-265.
2. Church, A. "A Note on the Entscheidungsproblem." J. Symb. Logic 1, (1936) 40-41.
3. Gödel, K. "On Formally Undecidable Propositions of Principia Mathematica and Related Systems I". Monatshefte fürMathematik und Physik 38 (1931), 173-198.
4. Kulkarni, R. G. "Expression for the Mathematical Constant e". viXra:1109.0054 (see, http://vixra.orq/abs/1109.0054)(September 2011).
5. Copeland, B. J. (editor) "The Essential Turing". Clarendon Press, 2004.
6. Hilbert, D. "Mathematical Problems". Lecture delivered before the International Congress of Mathematicians at Paris in 1900, English translation by Mary W. Newson, Bull. Amer. Math. Soc. 8 (1902), 437-479

What is claimed is:

1. A method for reducing a relation expression within computer programming code to a single arithmetic formula comprises implementing decimal logic functions, wherein the output of said decimal logic functions is one of 0 and 1, the method comprising:
   for a logical operation which is defined by a given decision tree with various logical if-else tests or one or more Boolean logic functions, converting the logical operation to the arithmetic formula utilizing a fundamental logic function Yn which only has three values for the values x>d, x=d, and x<d where x is a variable, d is a constant, and n represents a number of iterations;
   converting the n inputs to the logical operation to decimal format;
   processing the arithmetic formula with the converted inputs to determine the output of the arithmetic formula; and
   utilizing the output of the arithmetic formula as an output of the logical operation.

2. The method of claim 1, wherein the one or more Boolean logic functions comprise a truth table with the one or more Boolean logic functions expressed as the arithmetic formula by grouping the terms with true and false outcomes together and using decimal logic functions a and b.

3. The method of claim 1, further comprising:
converting the output of the arithmetic formula to a binary value for the output of the logical operation.

4. The method of claim 1, wherein the logical operation is a logical if-else test and the arithmetic formula utilizes decimal logic functions a, b, and c, the output for each of which is one of 0 and 1.

5. The method of claim 4, wherein the fundamental logic function Yn is a function of the variable x and the constant d such that
when x>d then a=1, b=0, c=0 and a function Z=f,
when x=d then b=1, c=0, a=0 and the function Z=g, and
when x<d then c=1, a=0, b=0 and the function Z=h.

6. The method of claim 5, wherein multiple logical if-else tests are implemented by multiple functions.

7. The method of claim 1, wherein the logical operation is a Boolean logic function and the arithmetic formula utilizes decimal logic functions a and b the output for each of which is one of 0 and 1.

8. The method of claim 7, wherein the Boolean logic function comprises any of combinational logic, sequential logic, or a combination thereof.

9. The method of claim 1, wherein the fundamental logic function Yn is implemented as a standard math library function in a programming language.

10. A processor comprising:
circuits configured to executed software which performs steps of
for reducing a relation expression within computer programming code to a single arithmetic formula comprises implementing decimal logic functions, wherein the output of said decimal logic functions is one of 0 and 1, for a logical operation which is defined by a given decision tree with various logical if-else tests or one or more Boolean logic functions, converting the logical operation to the arithmetic formula utilizing a fundamental logic function Yn which only has three values for the values x>d, x=d, and x<d where x is a variable, d is a constant, and n represents a number of iterations;
converting the n inputs to the logical operation to decimal format;
processing the arithmetic formula with the converted inputs to determine the output of the arithmetic formula; and
utilizing the output of the arithmetic formula as an output of the logical operation.

11. The processor of claim 10, wherein the one or more Boolean logic functions comprise a truth table with the one or more Boolean logic functions expressed as the arithmetic formula by grouping the terms with true and false outcomes together and using decimal logic functions a and b.

12. The processor of claim 10, wherein the steps further comprise:
converting the output of the arithmetic formula to a binary value for the output of the logical operation.

13. The processor of claim 10, wherein the logical operation is a logical if-else test and the arithmetic formula utilizes decimal logic functions a, b, and c, the output for each of which is one of 0 and 1.

14. The processor of claim 13, wherein the fundamental logic function Yn is a function of the variable x and the constant d such that
when x>d then a=1, b=0, c=0 and a function Z=f,
when x=d then b=1, c=0, a=0 and the function Z=g, and
when x<d then c=1, a=0, b=0 and the function Z=h.

15. The processor of claim 10, wherein multiple logical if-else tests are implemented by multiple functions.

16. The processor of claim 10, wherein the logical operation is a Boolean logic function and the arithmetic formula utilizes decimal logic functions a and b the output for each of which is one of 0 and 1.

17. The processor of claim 16, wherein the Boolean logic function comprises any of combinational logic, sequential logic, or a combination thereof.

18. The processor of claim 10, wherein the fundamental logic function Yn is implemented as a standard math library function in a programming language.

* * * * *